(12) United States Patent
Matsui

(10) Patent No.: US 7,633,126 B2
(45) Date of Patent: Dec. 15, 2009

(54) SEMICONDUCTOR DEVICE HAVING A SHARED CONTACT AND METHOD OF FABRICATING THE SAME

(75) Inventor: Koujirou Matsui, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 334 days.

(21) Appl. No.: 11/490,081

(22) Filed: Jul. 21, 2006

(65) Prior Publication Data
US 2007/0023832 A1     Feb. 1, 2007

(30) Foreign Application Priority Data

Aug. 1, 2005   (JP)   ............................. 2005-222493
Jun. 8, 2006   (JP)   ............................. 2006-159567

(51) Int. Cl.
*H01L 29/76* (2006.01)
(52) U.S. Cl. ........................ 257/382; 257/774; 257/344; 257/E21.167
(58) Field of Classification Search ................. 257/382, 257/774, 344, E21.167
See application file for complete search history.

(56) References Cited

U.S. PATENT DOCUMENTS

| | | | | |
|---|---|---|---|---|
| 5,482,895 | A * | 1/1996 | Hayashi et al. ............. | 438/620 |
| 6,074,960 | A * | 6/2000 | Lee et al. .................... | 438/749 |
| 6,177,304 | B1 * | 1/2001 | Li et al. ...................... | 438/233 |
| 6,274,409 | B1 * | 8/2001 | Choi ........................... | 438/128 |
| 6,534,389 | B1 * | 3/2003 | Ference et al. .............. | 438/586 |
| 6,593,632 | B1 * | 7/2003 | Avanzino et al. ............ | 257/382 |
| 6,635,966 | B2 * | 10/2003 | Kim ............................ | 257/758 |
| 6,673,715 | B2 * | 1/2004 | Trivedi et al. ............... | 438/655 |
| 6,724,085 | B2 * | 4/2004 | Tomita ........................ | 257/758 |
| 6,927,461 | B2 * | 8/2005 | Kim et al. .................... | 257/382 |

FOREIGN PATENT DOCUMENTS

| | | |
|---|---|---|
| JP | 61-168265 | 7/1986 |
| JP | 07-115198 | 5/1995 |
| JP | 2002-270701 | 9/2002 |

OTHER PUBLICATIONS

Low Cost 65nm CMOS Platform for Low Power & General Purpose Applications, F. Arnaud B. Duriez et al., 2004 Symposium on VLSI Technology Digest of Technical Papers.

* cited by examiner

*Primary Examiner*—Eugene Lee
(74) *Attorney, Agent, or Firm*—Young & Thompson

(57) ABSTRACT

In view of micronizing semiconductor device and of suppressing current leakage in a shared contact allowing contact between a gate electrode and an impurity-diffused region, a semiconductor device 100 includes a first gate electrode 108, a fourth source/drain region 114*b*, and a shared contact electrically connecting the both, wherein in a section taken along the gate length direction, the first gate electrode 108 and the fourth source/drain region 114*b* are disposed as being apart from each other, an element-isolating insulating film 102 is formed over the entire surface of a semiconductor substrate 160 exposed therebetween, and the distance between the first gate electrode 108 and the fourth source/drain region 114*b* is made substantially equal to the width of the sidewall formed on the side face of the first gate electrode 108, when viewed in another section taken along the gate length direction.

11 Claims, 12 Drawing Sheets

US 7,633,126 B2

SEMICONDUCTOR DEVICE HAVING A SHARED CONTACT AND METHOD OF FABRICATING THE SAME

This application is based on Japanese patent applications No. 2005-222493 and No. 2006-159567 the contents of which are incorporated hereinto by reference.

DISCLOSURE OF THE INVENTION

1. Technical Field

The present invention relates to a semiconductor device containing a shared contact connecting a gate electrode and a impurity-diffused region, and a method of fabricating the same.

2. Related art

Inverter circuit, for example, uses an interconnection structure electrically connecting a gate electrode of a MOS (metal-oxide-semiconductor) field effect transistor (referred to as "MOS transistor", hereinafter) and an impurity-diffused region such as source/drain region.

Japanese Laid-Open Patent Publication No. H7-115198 discloses a local interconnection structure connecting a gate electrode formed on a field oxide film and a source/drain region. Japanese Laid-Open Patent Publication No. S61-168265 and Japanese Laid-Open Patent Publication No. 2002-270701 disclose semiconductor devices each having an electrode interconnection formed in the field region, configured so that, when the contact window laid on both of the electrode interconnection and the source/drain region is opened, the end portion of the field region exposed in the contact window is covered with a sidewall formed on the side face of the electrode interconnection, so as to prevent a field insulating film from being etched and to prevent a silicon substrate from being exposed, even when an interlayer insulating film on the source/drain and on the electrode interconnection is etched.

On the other hand, F. Arnaud et al., "Low Cost 65 nm CMOS Platform for Low Power & General Purpose Applications", 2004 Symposium on VLSI Technology Digest of Technical Papers, p10-11, (2004) (see FIG. 2 and FIG. 7) discloses a structure having an impurity-diffused layer and a gate electrode connected with each other through a shared contact, wherein a region below the gate electrode is configured using an STI (shallow trench isolation).

FIG. 9 is a top view of a semiconductor device 70 containing an SRAM.

The drawing herein shows a configuration of a unit cell 1 of an SRAM (static random access memory). The unit cell 1 contains a semiconductor region 4 and a semiconductor region 6 formed in an N-well, a semiconductor region 30 and a semiconductor region 40 formed in a P-well, and an element-isolating insulating film 2 isolating them. The semiconductor region 30 has, formed therein, an n-type MOS transistor containing a gate electrode 32, and an n-type MOS transistor containing a gate electrode 8. The semiconductor region 40 has, formed therein, an n-type MOS transistor containing a gate electrode 42, and an n-type MOS transistor containing a gate electrode 16. The semiconductor region 4 has, formed therein, a p-type transistor containing the gate electrode 8, and a shared contact 22 electrically connecting a source/drain region 24a and the gate electrode 16 of the transistor. The semiconductor region 6 has, formed therein, a p-type transistor containing the gate electrode 16, and a shared contact 12 electrically connecting a source/drain region 14b and the gate electrode 8 of the transistor. In the periphery of the gate electrode 8, the gate electrode 16, the gate electrode 32 and the gate electrode 42, there are formed a sidewall 10, a sidewall 18, a sidewall 34, and a sidewall 44, respectively.

In the semiconductor region 30, a contact is formed on the source/drain region between the gate electrode 32 and the gate electrode 8. On the contact 50 and the shared contact 22, an interconnection 56 (indicated by a two-dot chain line in the drawing) electrically connecting the both is formed. In the semiconductor region 40, on the source/drain region between the gate electrode 42 and the gate electrode 16, a contact 52 is formed so as to electrically connecting them. On the contact 52 and the shared contact 12, there is formed an interconnection 54 electrically connecting them (indicated by a two-dot chain line in the drawing). It is to be noted herein that FIG. 9 indicates the semiconductor regions formed below the gate electrodes and the sidewalls using dashed lines, for simplicity in understanding.

A procedure of fabricating such semiconductor device 70 will be explained referring to FIGS. 10A to 10C. FIGS. 10A to 10C are corresponding to the C-C' section of FIG. 9.

First, an element-isolating insulating film 2 is formed in a semiconductor substrate 60. An N-well 62 is then formed by well implantation, followed by channel implantation. A gate insulating film 72 is then formed on the surface of the N-well 62, then a polysilicon layer is formed over the entire surface. The polysilicon layer is then etched to form a gate pattern, to thereby form the gate electrode 16 and the gate electrode 8. Next, impurity ion is implanted using the gate electrode 16 and the gate electrode 8 as a mask, to thereby form source/drain extension regions 15a, 15b, 69a and 69b.

An insulating film later remained as the sidewall is then formed over the entire surface, and then etched back to thereby form sidewalls 18a, 18b, 10a and 10b. Then using these sidewalls 18a, 18b, 10a and 10b as a mask, ion implantation is carried out to thereby form a source/drain region 14a and a source/drain region 14b. The source/drain region 14a and the source/drain region 14b are formed as having an impurity concentration higher than that of the source/drain extension regions 15a, 15b, 69a and 69b.

Next, a metal film is formed over the entire surface, and then annealed to thereby selectively form silicide layers 63a, 63b, 16a and 8a on the top surfaces of the source/drain region 14a, the source/drain region 14b, the gate electrode 16 and the gate electrode 8, respectively. An interlayer insulating film 66 is then formed over the entire surface. A structure shown in FIG. 10A is thus obtained.

Next, the interlayer insulating film 66 is selectively etched, to thereby form a contact hole 82 which reaches the silicide layer 63a on the source/drain region 14a, and a contact hole 80 which reaches the silicide layer 8a on the gate electrode 8 and the silicide layer 63b on the source/drain region 14b.

There has been known a problem in that, during formation of the contact hole 80, also the sidewall 10a is readily etched, supposedly because of reasons below. First, for the case where the sidewall 10a is composed of a material of the same series with a material composing the interlayer insulating film 66, also the sidewall 10a, together with the interlayer insulating film 66, is likely to be etched. Because the sidewall 10a is formed by etch-back of the insulating film, the outer side face of the sidewall 10a is consequently not normal to the surface of the semiconductor substrate 60, but slightly inclined. Any efforts of etching under conditions of selectively removing only the interlayer insulating film 66, by composing the side wall 10a with a material different from that of the interlayer insulating film 66, may therefore fail in ensuring a sufficient level of etching selectivity, so that the sidewall 10a may be etched. As a consequence, if several tens of thousands of unit cells 1 are formed in the semiconductor device 70, some of them may have, as shown in FIG. 10B, the sidewall 10a removed therefrom by etching.

Thereafter, the contact hole 82 and the contact hole 80 are filled with an electro-conductive material, to thereby form a contact 20 and the shared contact 12 (FIG. 10C).

However, some of the shared contacts 12 may contact with the source/drain extension region 69a if the sidewall 10a has been removed by etching when the contact holes 80 were formed. The source/drain extension region 69a has an impurity concentration smaller than that of the source/drain region 14b, and has no silicide layer formed on the surface thereof. For this reason, a problem has been arisen in that current leakage may occur in a region where the shared contact 12 comes into contact with the source/drain extension region 69a. In particular, such current leakage is more likely to occur when the source/drain extension region is formed only to a small depth.

On the other hand, in view of micronizing the semiconductor device, there is a demand on downsizing, for example, unit cells of SRAM as possible. The conventional semiconductor device has, however, failed in suppressing the current leakage at the contact interconnecting the gate electrode and the impurity-diffused region as the micronization advances.

In contrast to this, the technique described by F. Arnaud et al., causes no problem of current leakage in a region where the shared contact comes into contact with the source/drain extension region, because the STI is formed below the sidewall of the gate electrode. However, as shown in FIG. 7 in the literature by F. Arnaud et al., a problem arose in that the STI in a shared contact forming region was considerably removed, and another current leakage would occur. In order to make clear understanding of this problem, FIG. 11 shows a schematic drawing of a portion around the shared contact. A gate electrode 8 having a silicide layer 8a formed on the surface thereof, and the source/drain region 14b having a silicide layer 63b formed on the surface thereof are connected by the shared contact 12. Any large removal of the element-isolating insulating film (STI) 2 results in the current leakage between the well (semiconductor region) 62 and the shared contact 12.

SUMMARY OF THE INVENTION

According to the present invention, there is provided a semiconductor device having a gate electrode formed on a semiconductor substrate, an impurity-diffused region formed in the surficial portion of the semiconductor substrate on one side of the gate electrode, and a shared contact electrically connecting the gate electrode and the impurity-diffused region, having formed therein, when viewed in a first section taken along the gate length direction of the gate electrode, a sidewall formed on the side face on the above-described one side of the gate electrode, a source/drain extension region formed in the surficial portion of the semiconductor substrate in a self-aligned manner with respect to the gate electrode, and a source/drain region formed in a self-aligned manner with respect to the sidewall, and having an impurity concentration higher than that of the source/drain extension region, wherein, when viewed in a second section along the gate length direction of the gate electrode, the gate electrode and the impurity-diffused region are disposed as being apart from each other, an element-isolating insulating film is formed over the entire surface of the semiconductor substrate exposed between the gate electrode and the impurity-diffused region, and the distance between the gate electrode and the impurity-diffused region is substantially equal to the width of the sidewall as viewed in the first section.

"Substantially equal" herein means a configuration including a margin to some degree inevitably produced in the fabrication process of the semiconductor device.

According to the present invention, there is provided also a method of fabricating a semiconductor device which has:

a gate electrode formed on a semiconductor substrate so as to extend in one direction;

a sidewall formed on the semiconductor substrate and on the side face of the gate electrode on one side of the gate electrode, as having a predetermined width; and a source/drain extension formation-destined region having a predetermined width, located on the semiconductor substrate on one side of the gate electrode, so as to be adjacent to the gate electrode, wherein the method has:

forming, on the semiconductor substrate, an element-isolating insulating film partitioning a first semiconductor region and a second semiconductor region, so that the first semiconductor region is formed on the source/drain extension formation-destined region and so that the second semiconductor region is not formed on the source/drain extension formation-destined region;

forming, on the semiconductor substrate, the gate electrode so as to extend in the direction from the first semiconductor region to the second semiconductor region, in adjacent to the source/drain extension formation-destined region;

a first impurity implanting step implanting an impurity in the surficial portion of the semiconductor substrate using the gate electrode as a mask, to thereby form a source/drain extension region in the first semiconductor region;

forming, on the semiconductor substrate, the sidewall on the side face on the above-described one side of the gate electrode;

a second impurity implanting step implanting an impurity in the surficial portion of the semiconductor substrate using the sidewall as a mask, to thereby form, in the second semiconductor region, an impurity-diffused region as being a predetermined distance apart from the gate electrode; and forming, on the gate electrode and on the impurity-diffused region, a contact electrically connecting them with each other.

According to the present invention, even in a configuration having, in a partial region thereof, the sidewall on the side face of the gate electrode and having the source/drain extension region (or LDD: lightly doped drain) formed therebelow in a self-aligned manner, the region having the shared contact formed therein can be configured as having no source/drain extension region formed beside the gate electrode. The shared contact is no more in contact with the region having a low impurity concentration in the surficial portion of the semiconductor substrate, even if the sidewall has been removed in the process of forming the contact which allows therein electrical connection of the gate electrode and the impurity-diffused region connected through the shared contact. For this reason, it is made possible to suppress the current leakage at the shared contact connecting the gate electrode and the impurity-diffused region.

In general, the impurity-diffused region such as source/drain extension region of MOS transistors is formed by implanting ion over the entire surface. Therefore the semiconductor region located beside the gate electrode of the MOS transistor containing the source/drain extension region will have the source/drain extension region having a predetermined width. In the shared contact structure connecting the gate electrode and the impurity-diffused region, micronization can be realized by shortening the distance between the gate and the impurity-diffused region. However for the case where a portion of the gate electrode, used also as the gate electrode of a MOS transistor, is used as a connection point with the shared contact, excessively shortened distance between the gate electrode and the semiconductor region will undesirably result in formation of the source/drain extension region beside the gate electrode also at the connection point with the shared contact. In this case, removal-by-etching of the sidewall in the process of formation of the contact hole will cause the problem of current leakage as described in the above. The semiconductor device and the method of fabricating the same according to the present invention are configured so as to make the distance between the gate electrode and impurity-diffused region substantially equal to the width of the sidewall, and so as to form the element-isolating insulating film under the contact in the region between the gate electrode and the impurity-diffused region. It is therefore made possible to avoid the problem of current leakage, and to realize micronization of the semiconductor device.

According to the present invention, there is provided a technique of micronizing the semiconductor device, and of suppressing current leakage at the shared contact connecting the gate electrode and the impurity-diffused region.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1:
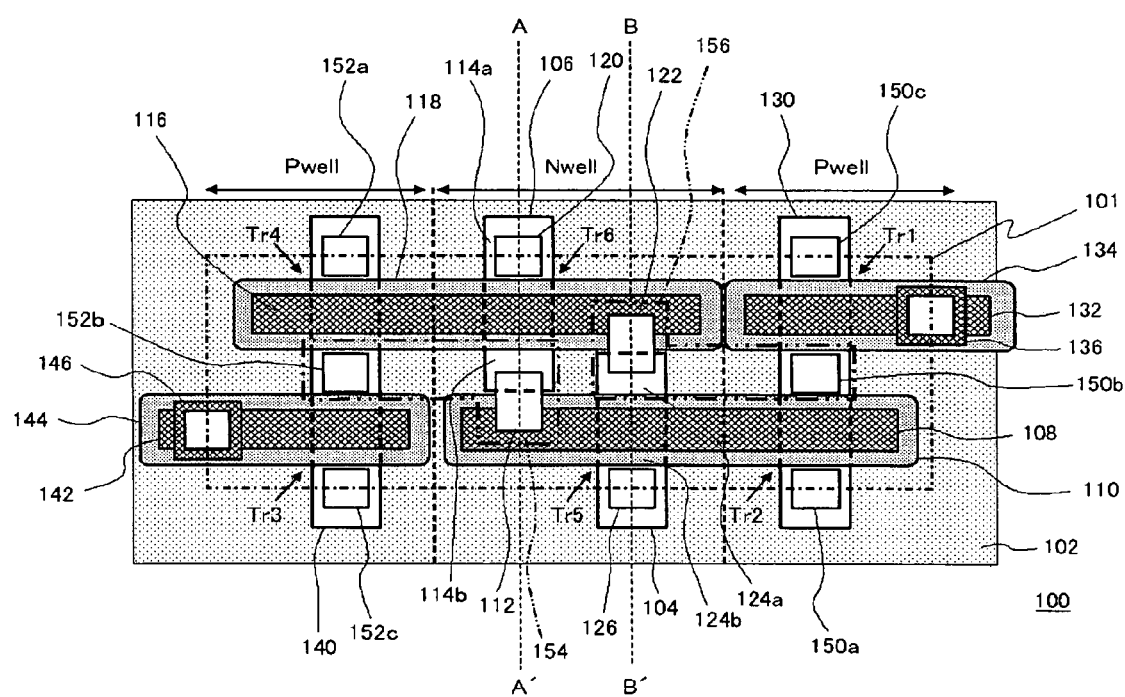
FIG. 1 is a top view of a configuration of a semiconductor device according to an embodiment of the present invention.

The invention will be now described herein with reference to an illustrative embodiment. Those skilled in the art will recognize that many alternative embodiments can be accomplished using the teachings of the present invention and that the invention is not limited to the embodiment illustrated for explanatory purposes.

Paragraphs below will explain an embodiment of the present invention, referring to the attached drawings. It is to be noted that, in all drawings, any constituents commonly appear will be given with the same reference numerals, so as to appropriately omit the explanation.

Figure 8A:
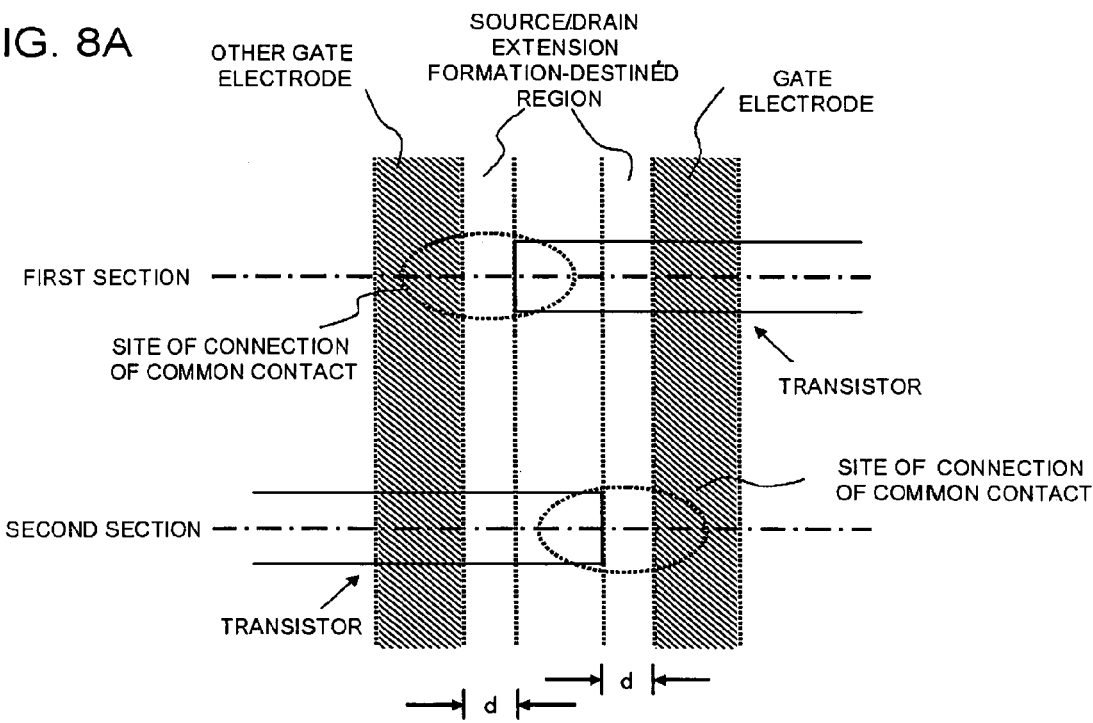
FIGS. 8A and 8B are schematic drawings explaining a configuration of the semiconductor device according to the embodiment of the present invention.
Figure 8B:
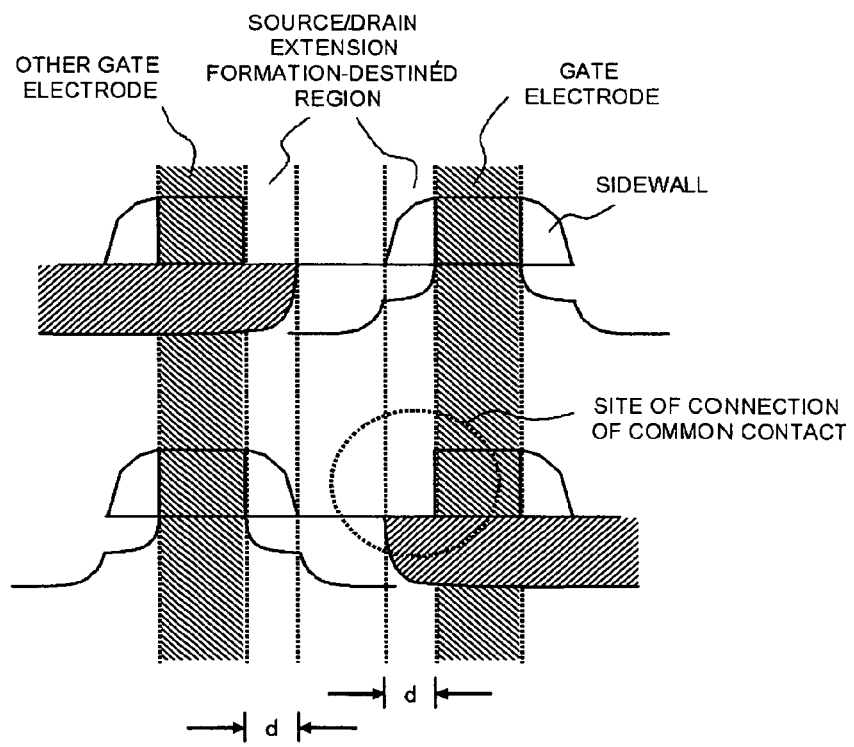

FIGS. 8A and 8B are schematic drawings explaining a configuration of a semiconductor device 100 according to the embodiment of the present invention. FIG. 8A is a schematic top view of the semiconductor substrate, and FIG. 8B is a schematic top view shown in FIG. 8A, overlaid with a sectional structure taken along a first section and a second section.

As shown in FIGS. 8A and 8B, a single gate electrode can serve, in one region, as the gate of the transistor having the source/drain extension region formed therein, and can provide, in another region, a site of contact with the shared contact (or common contact) making connection with the impurity-diffused region of another transistor. In this case, the source/drain extension formation-destined region in which the source/drain extension region will be formed later, is formed beside the gate electrode, if the semiconductor region is exposed there. Hereinafter, a region below the sidewall formed on the side face of the gate electrode is defined as the source/drain extension formation-destined region. In ion implantation, any exposed semiconductor region in the source/drain extension formation-destined region will have the source/drain extension region formed therein.

In this embodiment, the element-isolating insulating film is formed over the entire surface of the source/drain extension formation-destined region at the site of formation of shared contact. Therefore, the source/drain extension region will never be formed in the source/drain extension formation-destined region at the site of formation of shared contact. By virtue of this configuration, the shared contact will never be connected to the source/drain extension region even if the sidewall on the source/drain extension formation-destined region is removed at the site of formation of shared contact. As can be understood from the above, the current leakage, anticipated when the impurity-diffused region source/drain region and the gate electrode is connected through the shared contact, can be suppressed.

The semiconductor device of this embodiment can be configured also as having two gate electrodes disposed almost in parallel with each other on the semiconductor substrate. On the side portions between two these gate electrodes, the source/drain extension formation-destined regions are respectively located. In a first section, one gate electrode functions as the gate electrode of a transistor, and the other gate electrode provides a site of contact with the shared contact making connection with the source/drain diffusion region of the transistor. In a second section, the other gate electrode serves as the gate electrode of a transistor, and one gate electrode provides a site of contact with the shared contact making connection with the source/drain diffusion region of the transistor. In the second section, the other sidewall is formed on the source/drain extension formation-destined region on the side of the other transistor. In the first section, the above-described other gate electrode and the source/drain region are disposed as being apart from each other, the element-isolating insulating film is formed over the entire surface of the semiconductor substrate exposed between the above-described other gate electrode and the source/drain region, and the distance between the above-described other gate electrode and the source/drain region is substantially equal to the width of the other sidewall as viewed in the second section. By virtue of this configuration, the current leakage at the individual shared contacts can be suppressed, even in a configuration having the source/drain region of one transistor is connected to the gate electrode of the other transistor, and the gate electrode of one transistor is connected to the source/drain region of the other transistor.

In the embodiment of the present invention, the semiconductor device can be configured as having a plurality of combinations of the gate electrode, the shared contact and the source/drain extension region in a predetermined region, and as having all of the shared contacts contained in the predetermined region being not in contact with the source/drain extension region. The predetermined region herein may be, for example, a unit cell of SRAM.

FIG. 1 is a top view of the semiconductor device 100 according to the embodiment of the present invention. The semiconductor device 100 contains SRAMs. The drawing herein shows a configuration of a unit cell 101.

The unit cell 101 contains a semiconductor region 104 and a second semiconductor region 106 formed in an N-well, a third semiconductor region 130 and a fourth semiconductor region 140 formed in a P-well, and an element-isolating insulating film 102 isolating them. The third semiconductor region 130 has, formed therein, an n-type MOS transistor Tr1 having a third gate electrode 132, and an n-type MOS transistor Tr2 having the first gate electrode 108. The fourth semiconductor region 140 has, formed therein, an n-type MOS transistor Tr3 having a fourth gate electrode 142, and an n-type MOS transistor Tr4 having a second gate electrode 116.

The first semiconductor region 104 has, formed therein, a p-type transistor Tr5 having a first gate electrode 108, and a shared contact 122 electrically connecting a first source/drain region 124a and the second gate electrode 116 of the p-type transistor Tr5. The second semiconductor region 106 has, formed therein, a p-type transistor Tr6 having the second gate electrode 116 and a shared contact 112 electrically connecting a fourth source/drain region 114b and the first gate electrode 108 of the p-type transistor Tr6. The first gate electrode 108, the second gate electrode 116, the third gate electrode 132 and the fourth gate electrode 142 have a sidewall 110, a sidewall 118, a sidewall 134 and a sidewall 144, respectively, formed therearound.

In the third semiconductor region 130, a contact 150b is formed on the source/drain region between the third gate electrode 132 and the first gate electrode 108, and on the contact 150b and the shared contact 122, an interconnection 156 (indicated by two-dot chain line in the drawing) electrically connecting them is formed. In the fourth semiconductor region 140, a contact 152b is formed on the source/drain region between the fourth gate electrode 142 and the second gate electrode 116 so as to connect them, and on the contact 152b and the shared contact 112, an interconnection 154 (indicated by two-dot chain line in the drawing) electrically connecting them is formed. The third semiconductor region 130 has a contact 150a and a contact 150c formed therein, and the fourth semiconductor region 140 has a contact 152a and a contact 152c formed therein, respectively. The third gate electrode 132 has a contact 136 formed thereon, and the fourth gate electrode 142 has a contact 146 formed thereon. It is to be understood that FIG. 1 indicates the semiconductor regions formed under the gate electrodes, under the sidewalls and under the shared contacts using broken lines, for better understanding.

Figure 9:
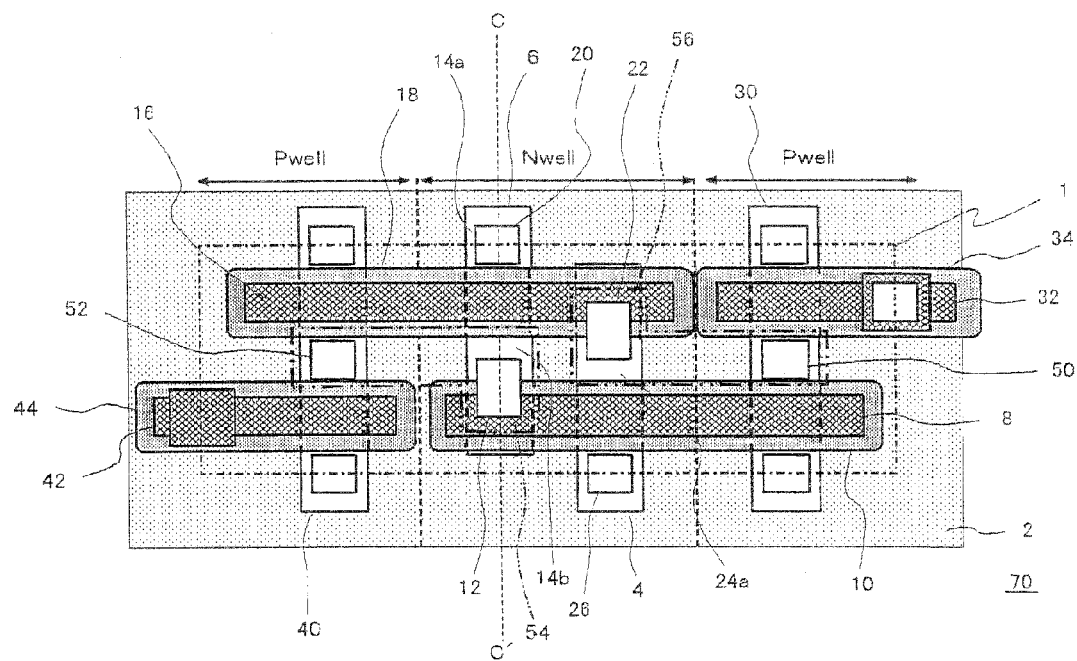
FIG. 9 is a top view showing a configuration of a conventional semiconductor device.
Figure 10:
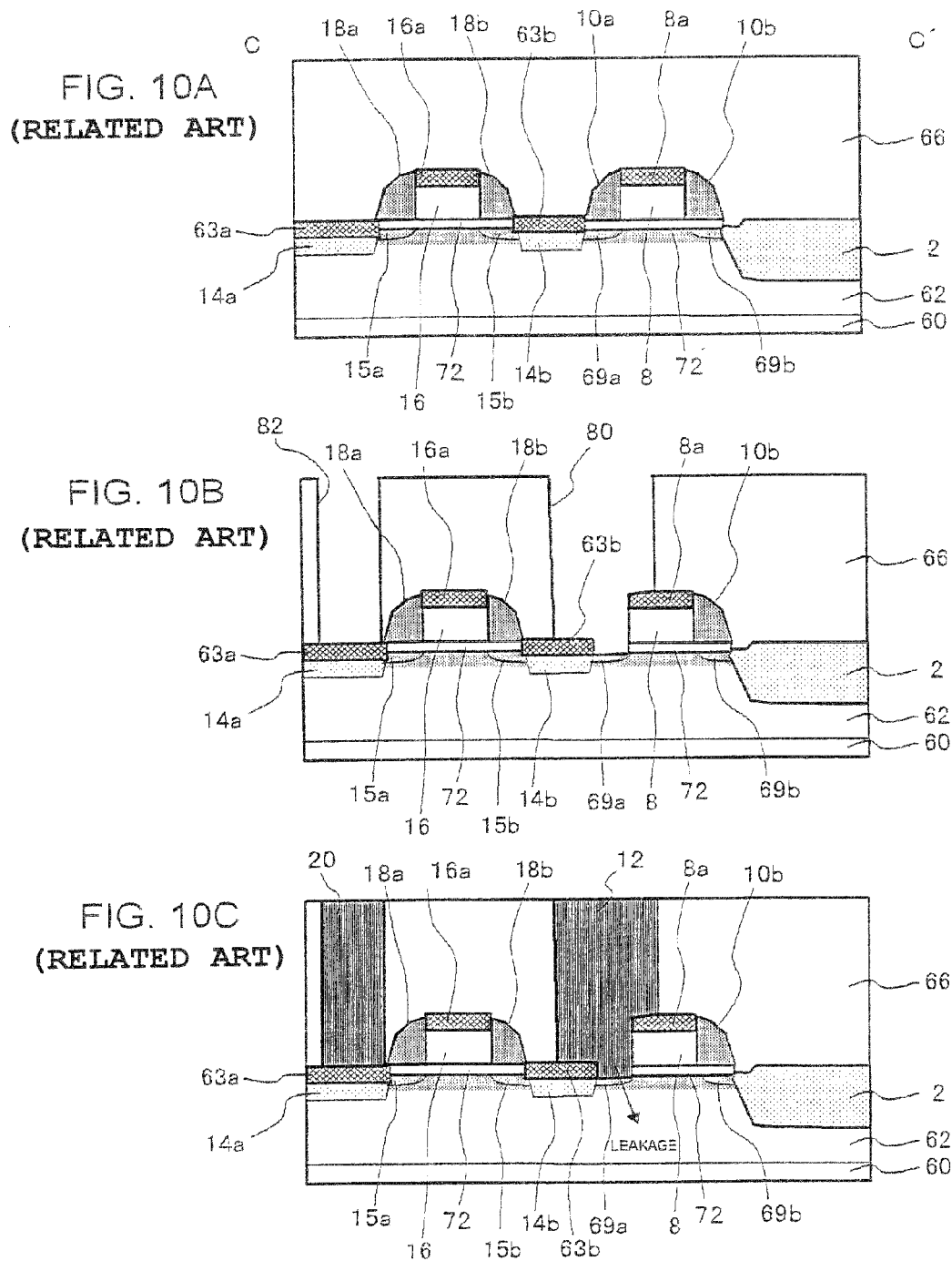
FIGS. 10A to 10C are sectional views sequentially showing procedures of fabricating the conventional semiconductor device.

Layout of the first semiconductor region 104 and the second semiconductor region 106 in the semiconductor device 100 according to the embodiment of the present invention differs from that of the semiconductor region 4 and the semiconductor region 6 in the conventional semiconductor device 70 explained referring to FIG. 9, but layouts of other constituents are same.

In the embodiment of the present invention, the p-type transistor Tr5 and the p-type transistor Tr6 are configured so that the gate electrodes of which are electrically connected to the source/drain regions of the other. More specifically, the first gate electrode 108 functions as the gate electrode of the p-type transistor Tr5 in the first semiconductor region 104, and is connected with the fourth source/drain region 114b of the p-type transistor Tr6 through the shared contact 112, in the section containing the second semiconductor region 106, taken along the gate length direction. Similarly, the second gate electrode 116 functions as the gate electrode of the p-type transistor Tr6 in the second semiconductor region 106, and is connected with the first source/drain region 124a of the p-type transistor Tr5, in the section containing the first semiconductor region 104, taken along the gate length direction. The section taken along the gate length direction (A-A' section, second section) in the second semiconductor region 106, and the section taken along the gate length direction (B-B' section, first section) in the first semiconductor region 104 are configured as being nearly symmetrical with each other.

Figure 2:
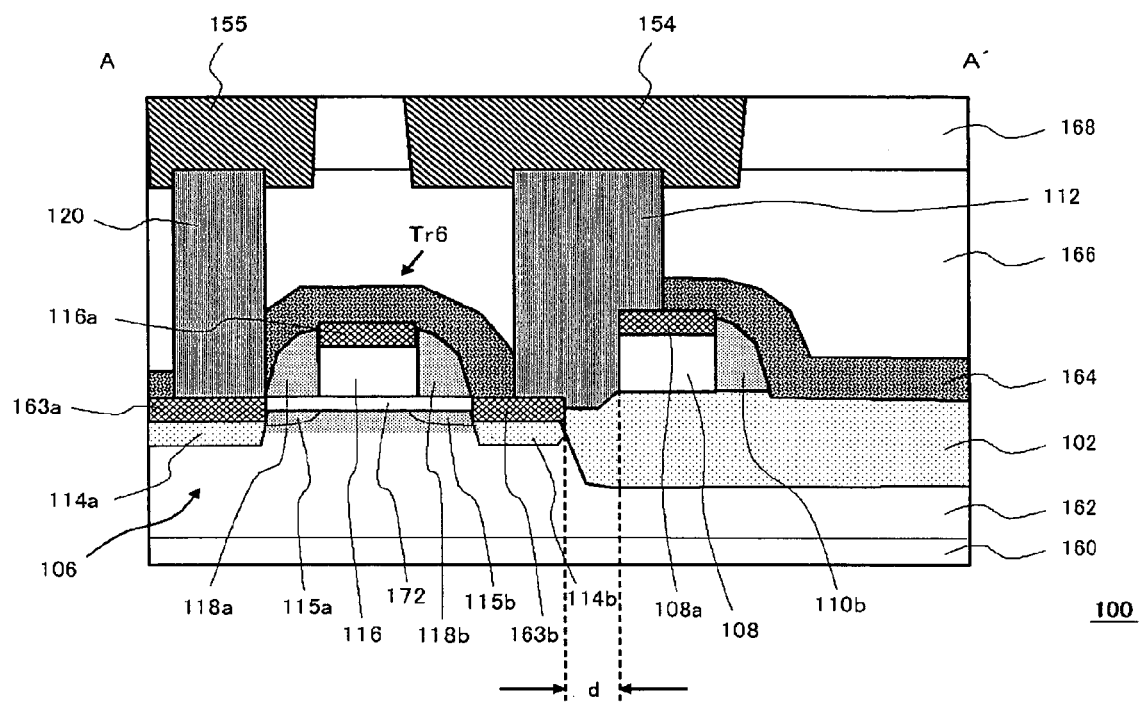
FIG. 2 is the A-A' section of FIG. 1.

FIG. 2 is the A-A' section of FIG. 1.

The semiconductor device 100 has a semiconductor substrate 160, an N-well 162 formed therein, and an element-isolating insulating film 102 formed in the N-well 162 and partitioning the second semiconductor region 106. The N-well 162 has the p-type transistor Tr6 disposed thereon, and the element-isolating insulating film 102 has, disposed thereon, a first gate electrode 108 having a silicide layer 108a formed thereon. The p-type transistor Tr6 is composed of a gate insulating film 172, a second gate electrode 116 having a silicide layer 116a formed on the top portion thereof, a side wall 118a and a sidewall 118b (sidewalls 118) formed on the side faces of the second gate electrode 116, a source/drain extension region 115a and a source/drain extension region 115b formed respectively under the sidewall 118a and the sidewall 118b, and a third source/drain region 114a and a fourth source/drain region 114b formed on both sides thereof. The third source/drain region 114a and the fourth source/drain region 114b have a silicide layer 163a and a silicide layer 163b respectively formed on the top portions thereof. On one side face of the first gate electrode 108, a second sidewall 110b (sidewall 110) is provided.

The semiconductor device 100 also includes an etching stopper insulating film 164 formed on the p-type transistor Tr6 and the first gate electrode 108, an interlayer insulating film 166 formed thereon, and an interlayer insulating film 168 formed further thereon. The interlayer insulating film 166 and the etching stopper insulating film 164 have, formed therein, a contact hole opened over a region ranging from the silicide layer 163b to the silicide layer 108a, and the shared contact 112 is formed in the contact hole. The interlayer insulating film 166 and the etching stopper insulating film 164 have, formed therein, also a contact 120 making contact with the silicide layer 163a of the p-type transistor Tr6. The contact 120 and the shared contact 112 are respectively connected to an interconnection 155 and an interconnection 154 formed in the interlayer insulating film 168.

Figure 3:
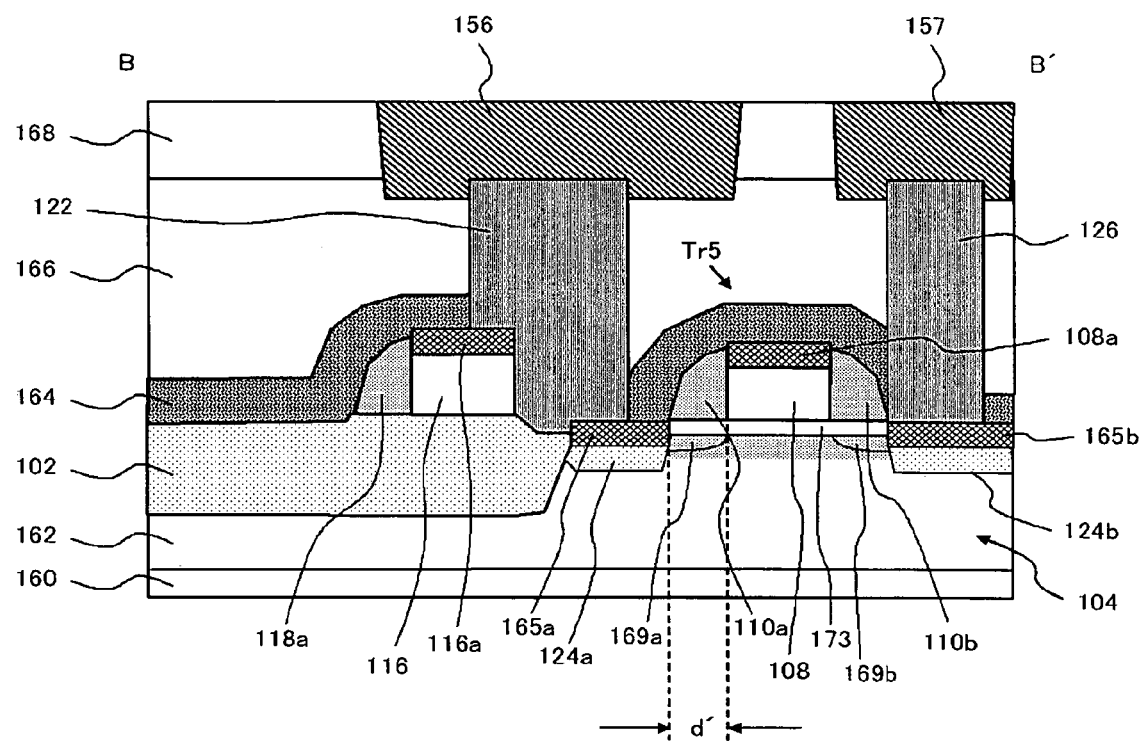
FIG. 3 is the B-B' section of FIG. 1.

FIG. 3 is the B-B' section of FIG. 1.

The p-type transistor Tr5 is disposed on the N-well 162 partitioned as the first semiconductor region 104 by the element-isolating insulating film 102, and the second gate electrode 116 is disposed on the element-isolating insulating film 102. The p-type transistor Tr5 is composed of a gate insulating film 173, a first gate electrode 108 having the silicide layer 108a formed on the top portion thereof, a first sidewall 110a and the second sidewall 110b formed on the side faces of the first gate electrode 108, a source/drain extension region 169a and a source/drain extension region 169b respectively formed under the first sidewall 110a and the second sidewall 110b, and the first source/drain region 124a and the second source/drain region 124b formed on both sides thereof. The first source/drain region 124a and the second source/drain region 124b have a silicide layer 165a and a silicide layer 165b respectively formed thereon. On one side face of the second gate electrode 116, the sidewall 118a is provided.

The interlayer insulating film 166 and the etching stopper insulating film 164 have, formed therein, a contact hole opened over a region ranging from the silicide layer 165a to the silicide layer 116a, and the shared contact 122 is formed in the contact hole. The interlayer insulating film 166 and the etching stopper insulating film 164 have, formed therein, a contact 126 making contact with the silicide layer 165b of the p-type transistor Tr5. The shared contact 122 and the contact 116 are respectively connected to an interconnection 156 and an interconnection 157 formed in the interlayer insulating film 168.

The distance "d" between the first gate electrode 108 and the fourth source/drain region 114b shown in FIG. 2 is made substantially equal to the width "d" of the first sidewall 110a shown in FIG. 3. As shown in FIG. 2, the element-isolating insulating film 102 is formed in a region between the first gate electrode 108 and the fourth source/drain region 114b.

Similarly, also the distance between the second gate electrode 116 and the first source/drain region 124a shown in FIG. 3 is made substantially equal to the width of the sidewall 118b shown in FIG. 2.

Paragraphs below will describe process steps of fabricating the semiconductor device 100 of this embodiment, referring to FIG. 4A to FIG. 6D. The explanation herein will be made referring to the A-A' section of FIG. 1, similarly as shown in FIG. 2. As described in the above, the A-A' section and the B-B' section of the semiconductor device 100 shown in FIG. 1 show nearly symmetrical configurations, so that in the process steps of fabrication described below, the p-type transistor Tr5 has a configuration similar to that of the p-type transistor Tr6.

First, the element-isolating insulating film 102 is formed in the semiconductor substrate 160 which is typically a silicon substrate. The element-isolating insulating film 102 can be configured as an STI (shallow trench isolation). The element-isolating insulating film 102 can be formed by forming a recess (not shown) in the semiconductor substrate 160, forming an insulating film such as a silicon oxide film over the entire surface of the semiconductor substrate 160, and by removing a portion of the insulating film exposed outside the recess by CMP (chemical mechanical polishing). In this process, the element-isolating insulating film 102 is formed so as to partition the second semiconductor region 106, so that the width of the source/drain extension formation-destined region between the gate electrode forming region in which the first gate electrode 108 will be formed in the later process step, and the second semiconductor region 106 is adjusted substantially equal to the width of the first sidewall 110a formed on the side face of the first gate electrode 108.

Figure 4A:
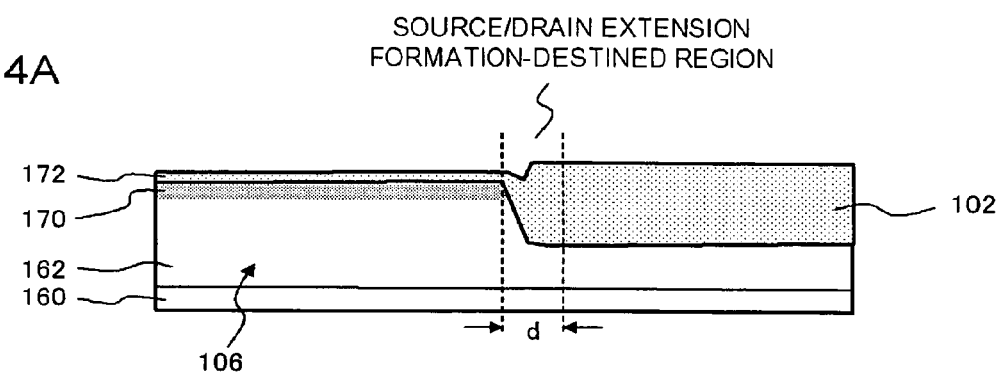
FIGS. 4A to 4C, FIGS. 5A to 5D, and FIGS. 6A to 6D are sectional views sequentially showing procedures of fabrication of the semiconductor device according to the embodiment of the present invention.
Figure 4B:
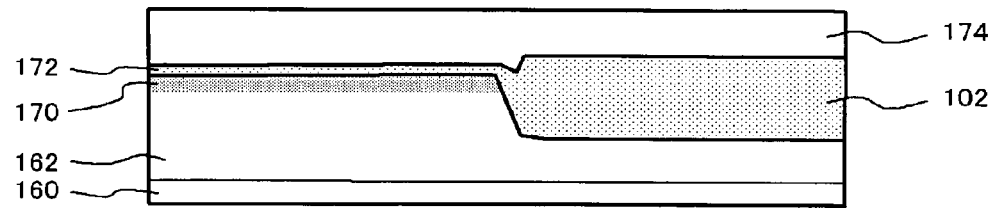
Figure 4C:
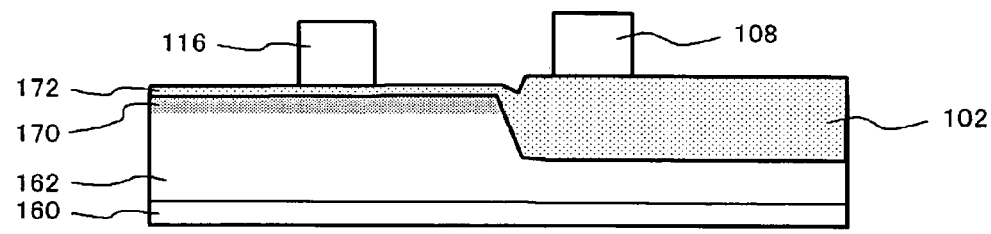

Next, the N-well 162 is formed by well-forming ion implantation, and a channel region 170 is then formed by channel-forming ion implantation. Thereafter the gate insulating film 172 is formed on the surface of the N-well 162 (FIG. 4A). Next, a polysilicon layer 174 is formed over the entire surface (FIG. 4B). The polysilicon layer 174 is then etched to obtain a gate pattern, to thereby form the second gate electrode 116 and the first gate electrode 108 (FIG. 4C).

Figure 5A:
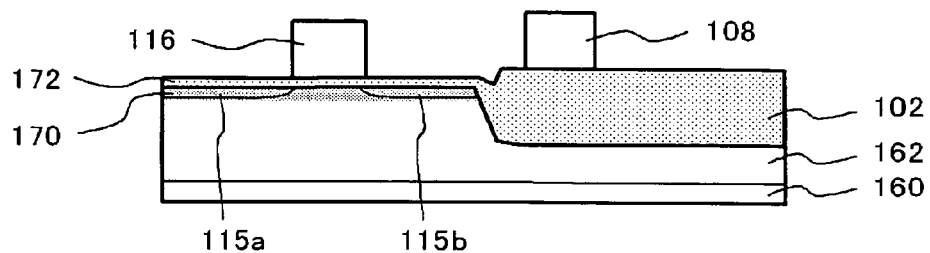

Thereafter, ion is implanted using the second gate electrode 116 and the first gate electrode 108 as a mask, to thereby form the source/drain extension region 115a and the source/drain extension region 115b in the surficial portion of the N-well 162 (FIG. 5A). In this process, as shown in the B-B' section in FIG. 3, also the source/drain extension region 169a and the source/drain extension region 169b are formed in a self-aligned manner on both sides of the first gate electrode 108. However, as shown in the A-A' section in FIG. 5A, the element-isolating insulating film 102 is formed between the second semiconductor region 106 and the first gate electrode 108. In addition, the first gate electrode 108 is formed on the element-isolating insulating film 102, so that the source/drain extension regions are never formed on both sides of the first gate electrode 108, in a region containing the A-A' section.

Figure 5B:
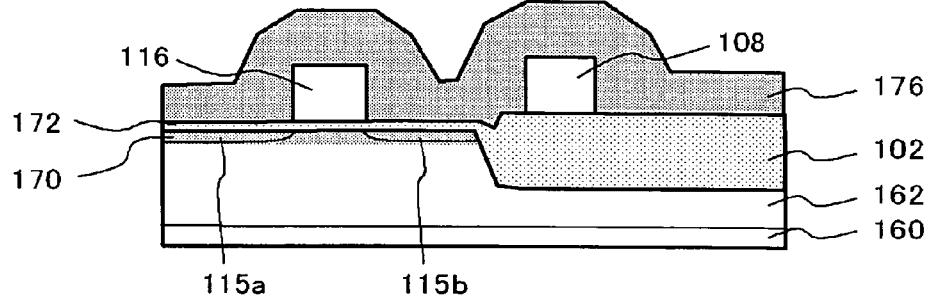
Figure 5C:
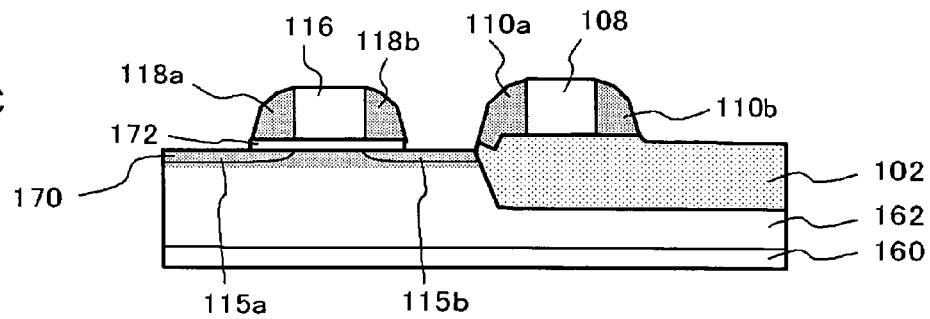

Next, an insulating film 176, later processed to give the sidewalls, is formed over the entire surface (FIG. 5B). The insulating film 176 can be configured by using a silicon oxide film or a silicon nitride film. Next, the insulating film 176 is anisotropically etched so as to respectively form the sidewall 118a and the sidewall 118b on both side faces of the second gate electrode 116, and to form the first sidewall 110a and the second sidewall 110b on both side faces of the first gate electrode 108 (FIG. 5C). In this embodiment, as described in the above, the element-isolating insulating film 102 is formed so that the distance between the first gate electrode 108 and the second semiconductor region 106 will be substantially equal to the width of the first sidewall 110a. As shown by the section in FIG. 5C, the element-isolating insulating film 102 is formed under the first sidewall 110a.

Figure 5D:
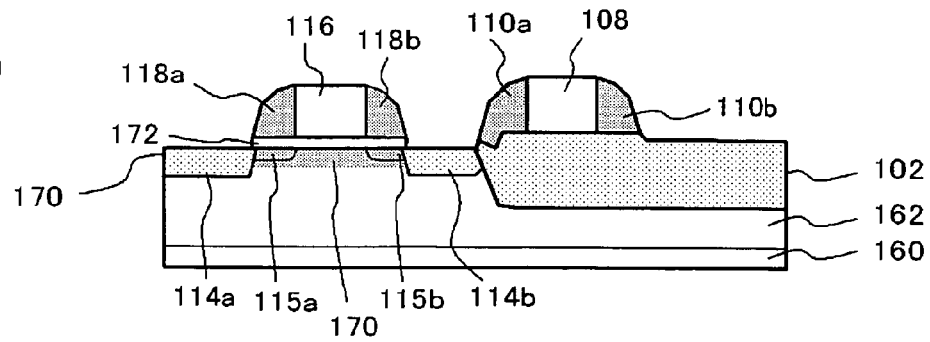

Ion is then implanted using the sidewall 118a, the sidewall 118b and the first sidewall 110a as a mask, to thereby form the third source/drain region 114a and the fourth source/drain region 114b (FIG. 5D). As a consequence, the fourth source/drain region 114b, having an impurity concentration higher than that of the source/drain extension region such as the source/drain extension region 169a, is formed in a region of the second semiconductor region 106 adjacent to the element-isolating insulating film 102. In this process, as shown by the B-B' section in FIG. 3, the first source/drain region 124a and the second source/drain region 124b are formed using the first sidewall 110a and the second sidewall 110b as a mask. It is to be noted that the fourth source/drain region 114b in the second semiconductor region 106 and the first source/drain region 124a in the first semiconductor region 104 are formed at the same time by ion implantation as shown in FIG. 5A and ion implantation as shown in FIG. 5D, so that they have an identical impurity concentration profile over the entire range thereof in the depth-wise direction and in the gate length direction.

Figure 6A:
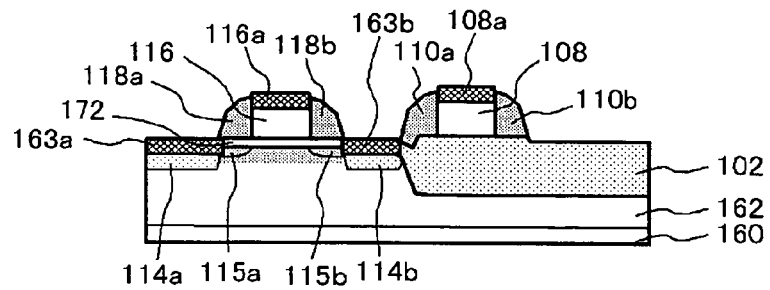

Next, a metal film is formed over the entire surface, and then annealed to thereby selectively form silicide layers 163a, 163b, 116a and 108a on the top surfaces of the third source/drain region 114a, the fourth source/drain region 114b, the second gate electrode 116 and the first gate electrode 108, respectively (FIG. 6A). Provision of such silicide layers is successful in lowering the electric resistance of the semiconductor device 100. It is also made possible to prevent the current leakage in the shared contact 112 from occurring.

Next, the etching stopper insulating film 164 is formed over the entire surface. The etching stopper insulating film 164 may be composed of a material different from those composing the element-isolating insulating film 102 and the interlayer insulating film 166. As a consequence, the element-isolating insulating film 102 can be prevented from being etched in the later process of forming the contact hole in a region ranging from the fourth source/drain region 114b to the first gate electrode 108. The interlayer insulating film 166 is then formed on the etching stopper insulating film 164

Figure 6B:
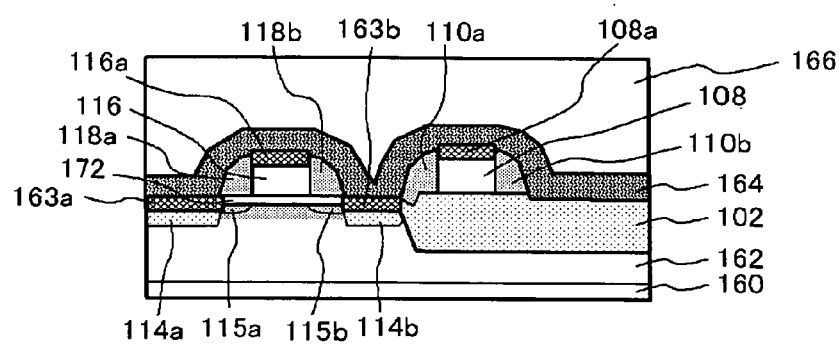

(FIG. 6B). The interlayer insulating film 166 may be formed typically by using a silicon oxide film.

Figure 6C:
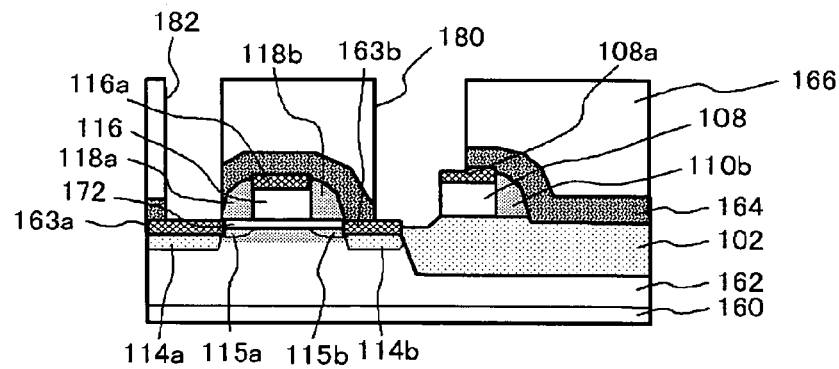

Next, the interlayer insulating film 166 is selectively removed, to thereby form the a contact hole 182 which communicates with the silicide layer 163a on the third source/drain region 114a, and a contact hole 180 opened over a region ranging from the silicide layer 163b on the fourth source/drain region 114b to the silicide layer 108a on the first gate electrode 108 (FIG. 6C). Procedures for forming the contact hole 180 will be described later.

Figure 6D:
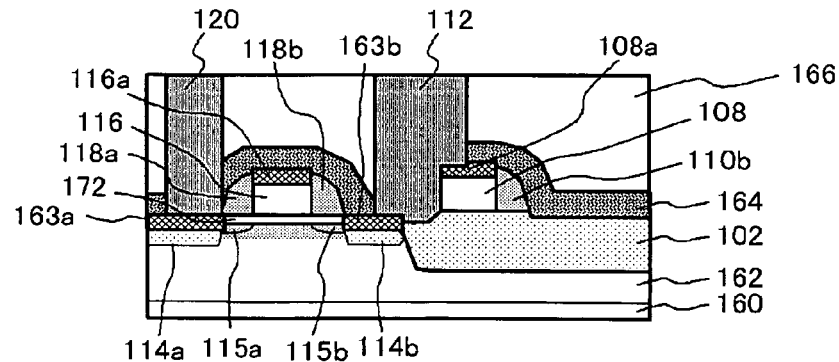

The contact hole and 182 the contact hole 180 are then filled with an electro-conductive material to thereby form the contact 120 and the shared contact 112 (FIG. 6D). Next, the interlayer insulating film 168 is formed on the interlayer insulating film 166, etched according to a predetermined pattern to thereby form therein interconnection trenches, and the interconnection trenches are filled with an interconnection material, to thereby form the interconnection 155 and the interconnection 154 connected to the contact 120 and the shared contact 112, respectively. The semiconductor device 100 configured as shown in FIG. 2 is thus obtained.

Figure 7A:
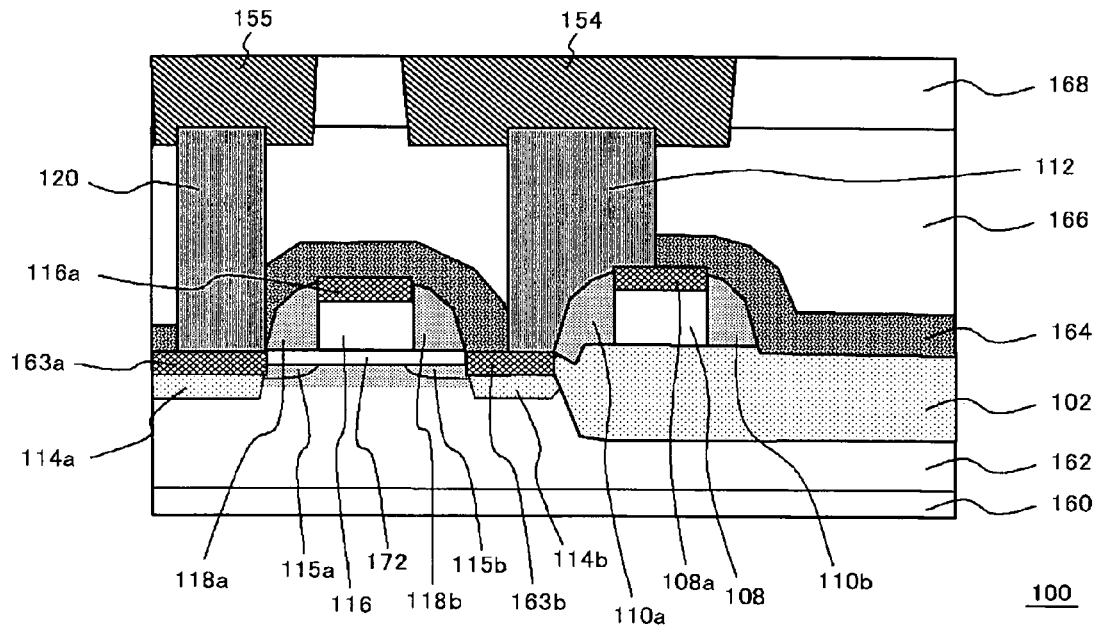
FIGS. 7A and 7B are sectional views showing configurations of the semiconductor device according to the embodiment of the present invention.

The contact hole 180 explained referring to FIG. 6C is formed by the procedures below. First, using a resist film already patterned according to a predetermined geometry, the interlayer insulating film 166 is selectively dry-etched. In this process, the etching stopper insulating film 164 is already formed over the entire surface under the interlayer insulating film 166. Etching of the interlayer insulating film 166 can therefore be stopped on the etching stopper insulating film 164, if the etching is proceeded under a condition of ensuring a large etching selectivity with respect to the etching stopper insulating film 164. Then the etching stopper insulating film 164 is selectively removed under a condition of ensuring a large etching selectivity with respect to the first sidewall 110a and the element-isolating insulating film 102, and thereby the contact hole can be formed while leaving the first sidewall 110a unremoved on the side face of the first gate electrode 108. FIG. 7A shows a configuration of the unit cell 101 having the first sidewall 110a left unremoved on the side face of the first gate electrode 108, even after the etching for forming the contact hole 180.

Figure 7B:
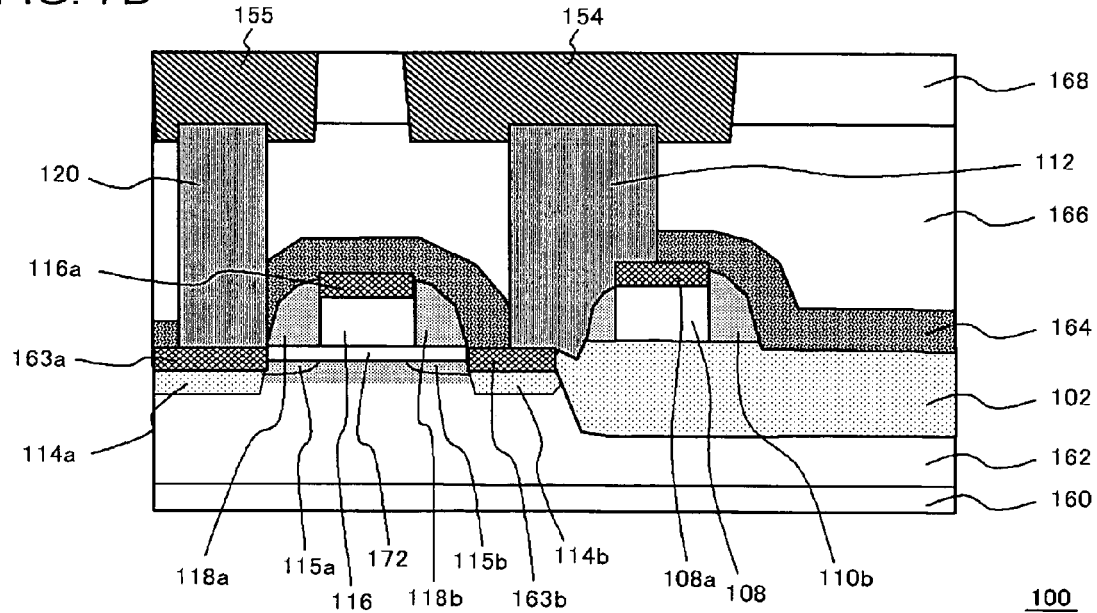

However, on the first sidewall 110a, the etching stopper insulating film 164 formed thereon may sometimes be etched when the interlayer insulating film 166 is etched, because the first sidewall 110a has a slightly inclined geometry, rather than a vertical geometry, with respect to the surface of the semiconductor device 100 as described in the above. This case may sometimes result in etching of the first sidewall 110a at the same time. As a consequence, for the case where the semiconductor device 100 contains several tens of thousands of unit cells 101, as shown in FIG. 6C, some of the unit cells 101 may be obtained as having the first sidewall 110a completely removed therefrom, or may be obtained as having a portion of the first sidewall 110a removed therefrom, thereby having a region between the first gate electrode 108 and the fourth source/drain region 114b where the shared contact 112 and the element-isolating insulating film 102 are brought into direct contact (FIG. 7B).

In this embodiment, in a region containing the A-A' section, the element-isolating insulating film 102 is formed in the source/drain extension formation-destined region under the first sidewall 110a, so as to contact with the fourth source/drain region 114b and the silicide layer 163b formed thereon. Therefore, the shared contact 112 will never contact with the source/drain extension region having a low impurity concentration, even if the first sidewall 110a is removed when the contact hole 180 is formed, so that the current leakage is avoidable.

The semiconductor device 100 of the present invention is configured so as to avoid a problem of current leakage, so as to equalize the distance between the fourth source/drain region 114b and the first gate electrode 108 with the width of the first sidewall 110a as viewed in a region containing the A-A' section, and so as to form the element-isolating insulating film in the surficial portion of the semiconductor substrate 160 in this region, to thereby realize micronization of the semiconductor device 100.

As is obvious from comparison of the semiconductor device 100 of this embodiment shown in FIG. 1 with the semiconductor device 70 shown in FIG. 9, the above-described problem of current leakage can be solved only by altering a partition layout of the second semiconductor region 106 and the first semiconductor region 104 by the element-isolating insulating film 102, without altering layout of another element. It is also made possible to avoid direct contact between the shared contact and the low-impurity-concentration region in the surficial portion of the semiconductor substrate 160 even when misalignment should occur, by partitioning the first semiconductor region 104 and the second semiconductor region 106 using the element-isolating insulating film 102, and by disposing, at the common-contact-forming site, the first gate electrode 108 and the second gate electrode 116 on the element-isolating insulating film 102.

Figure 11:
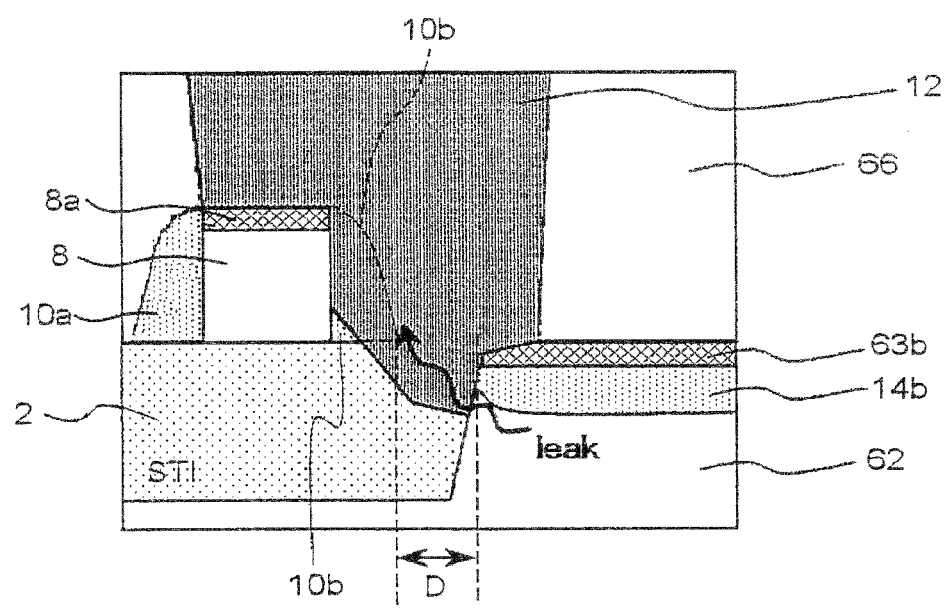
FIG. 11 is a schematic drawing of a portion around the shared contact of the conventional semiconductor device.

Comparing now the configurations described in the present invention and described by F. Arnaud et al., the configuration described by F. Arnaud et al. has, in the common-contact-forming region, the element-isolating insulating film not covered by the sidewall. The element isolating region is therefore likely to be etched when the interlayer insulating film is etched, and tends to show a largely-notched geometry of the element-isolating insulating film (STI) 2 as shown in FIG. 11. This problem will become more distinctive unless the etching stopper insulating film 164 described in the above embodiment is used, and will be causative of leakage current. In contrast to this, the present invention can suppress the amount of removal of the element-isolating insulating film in the shared contact region.

The present invention can also reduce the cell area as compared with that of the SRAM described by F. Arnaud et al. Based on the scale given on the SEM photograph in FIG. 7 of the literature by F. Arnaud et al., the length D of the element-isolating insulating film (STI) 2 projecting out from the edge of the side wall 10b into the source/drain region 14b shown in FIG. 11 can be estimated as approximately 35 nm.

Figure 12:
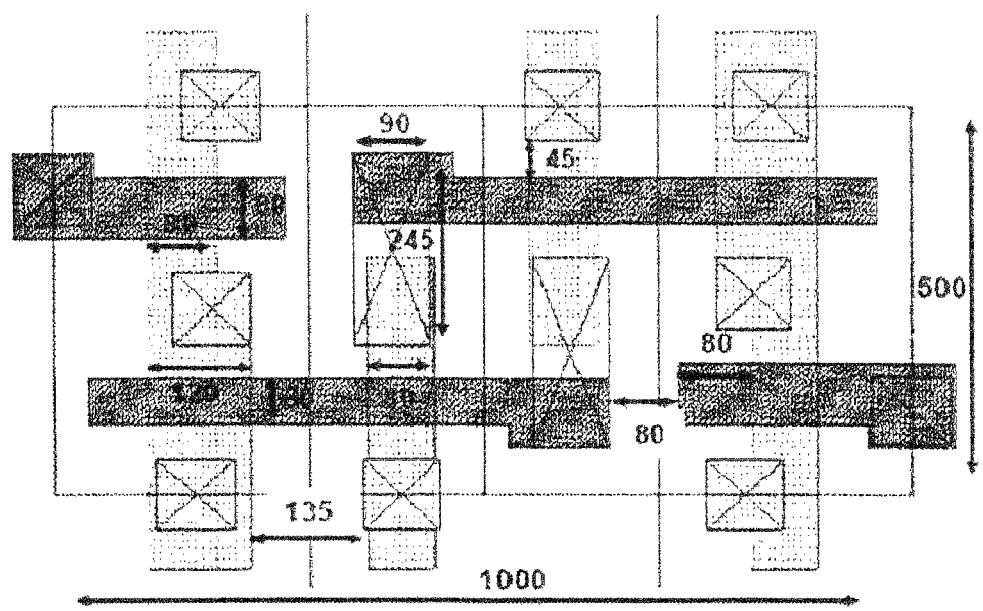
FIG. 12 is a drawing corresponded to a conventional configuration.

FIG. 12 is a drawing corresponded to FIG. 2 in the literature by F. Arnaud et al. According to the present invention, the distance between the gate electrode and the impurity-diffused region, connected with each other by the shared contact, is substantially same as the width of the sidewall, so that the length in the longitudinal direction of the shared contact of the SRAM unit cell in the layout shown in FIG. 12 of the literature by F. Arnaud et al. can be shortened by 35 nm×2=70 nm or around. Amount of reduction in the area of the SRAM unit cell is calculated as 1 μm×(0.035×2) μm=0.07 μm². This means a rate of reduction of approximately 14%, because the SRAM unit cell without adopting the present invention has an area of 0.5 μm². The present invention is, therefore, effective also in reduction in the cell area, that is, micronization of the semiconductor device.

The embodiment of the present invention has been described in the above merely for exemplary purposes, while allowing adoption of any other configurations.

The embodiment in the above has explained a case where the element-isolating insulating film 102 was configured as STI, whereas the element-isolating insulating film 102 can be configured also as a LOCOS (local oxidation of silicon) film. The element-isolating insulating film 102 configured as STI can be formed also by forming a recess in the semiconductor substrate 160, forming for example a first insulating film on the side face of the recess, and filling the recess with a second insulating film different from the first insulating film. In this case, the first insulating film may be a silicon nitride film, and the second insulating film may be a silicon oxide film. Provision of such first insulating film on the side face of the element-isolating insulating film 102 makes it possible to control the element-isolating insulating film 102 so that the end portion thereof is not etched.

Although the embodiment in the above exemplified an SRAM, the present invention is also applicable to various semiconductor devices other than SRAM, such as flipflop structure, containing shared contact allowing therein connection of the gate electrode and the impurity-diffused region.

The embodiment in the above explained an exemplary case where the p-type transistor and the shared contact were formed in the N-well, but an n-type transistor and the shared contact can be formed in a P-well in a similar manner.

It is apparent that the present invention is not limited to the above embodiment, that may be modified and changed without departing from the scope and spirit of the invention.

What is claimed is:

1. A semiconductor device comprising:
   a first gate electrode formed over a semiconductor substrate in a first region and a second region;
   an impurity-diffused region formed in said first region in the surficial portion of said semiconductor substrate at one side of said first gate electrode;
   a first shared contact formed in said first region electrically connecting said first gate electrode and said impurity-diffused region;
   a first sidewall formed in said first region and said second region, on the side face on said one side of said first gate electrode;
   a first source/drain extension region formed in said second region and in the surficial portion of said semiconductor substrate in a self-aligned manner with respect to said first gate electrode; and
   a first source/drain region formed in said second region and in a self-aligned manner with respect to said first sidewall, and having an impurity concentration higher than that of said first source/drain extension region,
   wherein a portion of said first gate electrode and said impurity-diffused region are disposed as being apart from each other in said first region, an element-isolating insulating film is formed over the entire surface of said semiconductor substrate between said first gate electrode and said impurity-diffused region, and the distance between said first gate electrode and said impurity-diffused region is substantially equal to the width of said first sidewall.

2. The semiconductor device according to claim 1, wherein said impurity-diffused region has an impurity concentration profile same as that of said first source/drain region.

3. The semiconductor device according to claim 2, wherein said first shared contact and said element-isolating insulating film are brought into direct contact, between said first gate electrode and said impurity-diffused region.

4. The semiconductor device according to claim 1 wherein said impurity-diffused region contains a silicide layer formed on the surface thereof, and said first shared contact contacts with said silicide layer.

5. The semiconductor device according to claim 4, wherein said first shared contact and said element-isolating insulating film are brought into direct contact, between said first gate electrode and said impurity-diffused region.

6. The semiconductor device according to claim 1, further comprising:
   an etching stopper insulating film formed so as to cover said impurity-diffused region and said first gate electrode, and composed of a material different from that composing said element-isolating insulating film; and
   an interlayer insulating film formed on said etching stopper insulating film, and composed of a material different from that composing said etching stopper insulating film,
   wherein said first shared contact is formed on said impurity-diffused region and said first gate electrode, using an electro-conductive material filled in a contact hole formed in said interlayer insulating film and said etching stopper insulating film.

7. The semiconductor device according to claim 6, wherein said first shared contact and said element-isolating insulating film are brought into direct contact, between said first gate electrode and said impurity-diffused region.

8. The semiconductor device according to claim 1, wherein said first shared contact and said element-isolating insulating film are brought into direct contact, between said first gate electrode and said impurity-diffused region.

9. The semiconductor device according to claim 1, wherein said element-isolating insulating film is formed so as to extend into a region containing a portion under said first gate electrode, and said first gate electrode is formed on said element-isolating insulating film.

10. The semiconductor device according to claim 1, further comprising a second gate electrode formed on said semiconductor substrate on said one side of said first gate electrode in said first region and said second region, so as to extend in parallel with said first gate electrode, and a second shared contact electrically connecting said second gate electrode and said first source/drain extension region in said second region,
    a second sidewall formed on the side face of said second gate electrode on one side opposing to said first gate electrode, and a second source/drain region formed in the surficial portion of said semiconductor substrate in a self-aligned manner with respect to said second gate electrode, said impurity-diffused region being formed so as to contact with said second source/drain region, in a self-aligned manner with respect to said second sidewall, and
    said second gate electrode and said first source/drain extension region disposed as being apart from each other, an element-isolating insulating film formed over the entire surface of said semiconductor substrate exposed between said second gate electrode and said first source/drain extension region, the distance between said second gate electrode and said first source/drain extension region being substantially equal to the width of said second sidewall.

11. The semiconductor device according to claim 1, configured:
    so as to contain, in a predetermined region, a plurality of combinations of said first gate electrode, said first shared contact, and said first source/drain extension region; and
    so that all of said shared contacts contained in said predetermined region do not contact with said first source/drain extension region.

* * * * *

UNITED STATES PATENT AND TRADEMARK OFFICE
CERTIFICATE OF CORRECTION

| | | |
|---|---|---|
| PATENT NO. | : 7,633,126 B2 | Page 1 of 1 |
| APPLICATION NO. | : 11/490081 | |
| DATED | : December 15, 2009 | |
| INVENTOR(S) | : Koujirou Matsui | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 481 days.

Signed and Sealed this

Twenty-first Day of December, 2010

David J. Kappos
*Director of the United States Patent and Trademark Office*